(12) United States Patent
Sakai

(10) Patent No.: US 11,146,254 B2
(45) Date of Patent: Oct. 12, 2021

(54) DRIVING DEVICE AND POWER MODULE

(71) Applicant: Mitsubishi Electric Corporation, Tokyo (JP)

(72) Inventor: Shinji Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 168 days.

(21) Appl. No.: 16/265,689

(22) Filed: Feb. 1, 2019

(65) Prior Publication Data
US 2019/0296731 A1 Sep. 26, 2019

(30) Foreign Application Priority Data

Mar. 20, 2018 (JP) .............................. JP2018-051893

(51) Int. Cl.
*H03K 17/08* (2006.01)
*H03K 17/0812* (2006.01)
*H01L 23/00* (2006.01)
*H02H 1/00* (2006.01)

(52) U.S. Cl.
CPC ....... *H03K 17/08122* (2013.01); *H01L 24/49* (2013.01); *H02H 1/0007* (2013.01); *H03K 17/08128* (2013.01); *H01L 2924/13055* (2013.01); *H01L 2924/13064* (2013.01); *H01L 2924/13091* (2013.01); *H01L 2924/1426* (2013.01)

(58) Field of Classification Search
CPC ........ H03K 17/08122; H03K 17/08128; H01L 24/49; H01L 2924/13055; H01L 2924/13064; H01L 2924/13091; H01L 2924/1426; H02H 1/0007

See application file for complete search history.

(56) References Cited

U.S. PATENT DOCUMENTS

| 2012/0153719 | A1* | 6/2012 | Inaba ................... | H03K 17/168 307/10.1 |
| 2013/0265056 | A1* | 10/2013 | Lin ......................... | G09G 3/006 324/414 |
| 2016/0013788 | A1* | 1/2016 | Thalheim ............. | H03K 17/168 361/101 |
| 2016/0028219 | A1 | 1/2016 | Habu et al. | |
| 2016/0124037 | A1* | 5/2016 | Zhang ................ | G01R 31/3275 324/762.08 |
| 2017/0019093 | A1 | 1/2017 | Kanda et al. | |

FOREIGN PATENT DOCUMENTS

| JP | 2015-005866 A | 1/2015 |
| JP | 2017-022678 A | 1/2017 |
| WO | 2014/115272 A1 | 7/2014 |

* cited by examiner

Primary Examiner — Rafael O De Leon Domenech
(74) Attorney, Agent, or Firm — Studebaker & Brackett PC

(57) ABSTRACT

To provide a technique to complement overcurrent protection and short circuit protection. An LVIC includes an overcurrent detector configured to detect whether or not a first current flowing through a load and a semiconductor switching element is abnormal and a short-circuit detector configured to detect whether or not a second current flowing not through the load but through the semiconductor switching element is abnormal. The LVIC interrupts the semiconductor switching element based on a detection result of the overcurrent detector and a detection result of the short-circuit detector.

9 Claims, 5 Drawing Sheets

F I G. 3
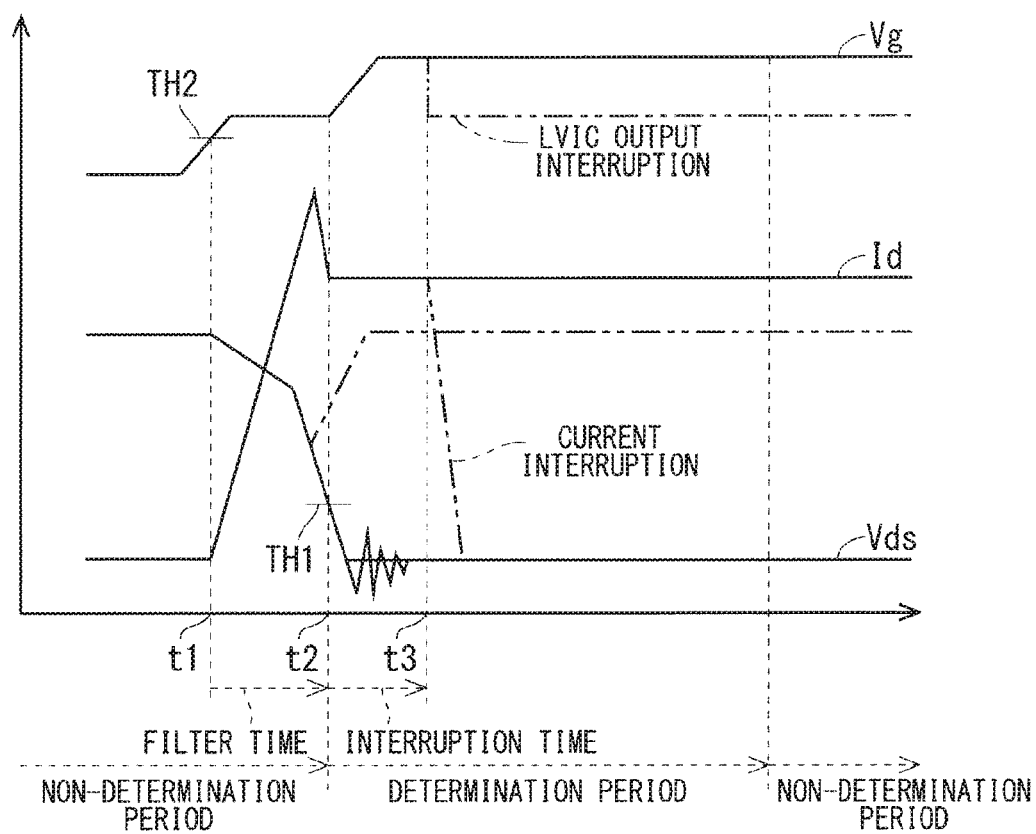

F I G. 4
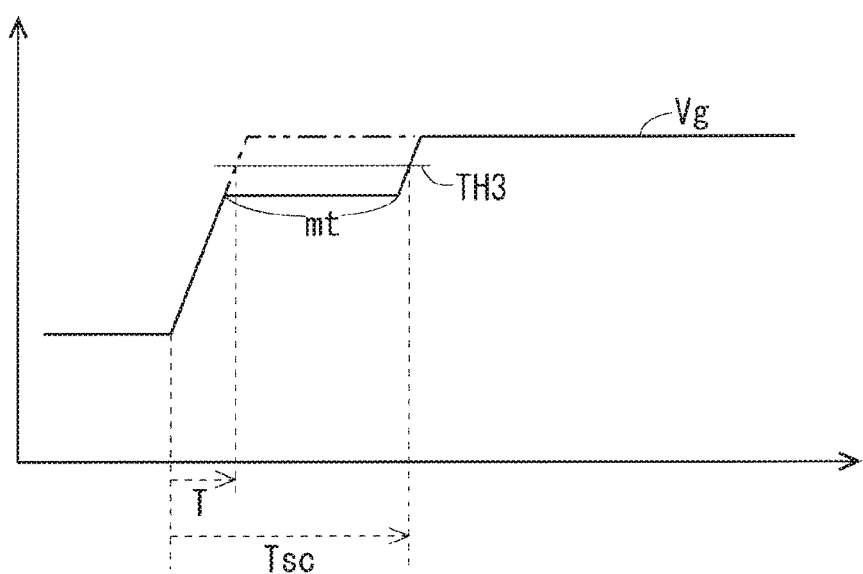

F I G. 5
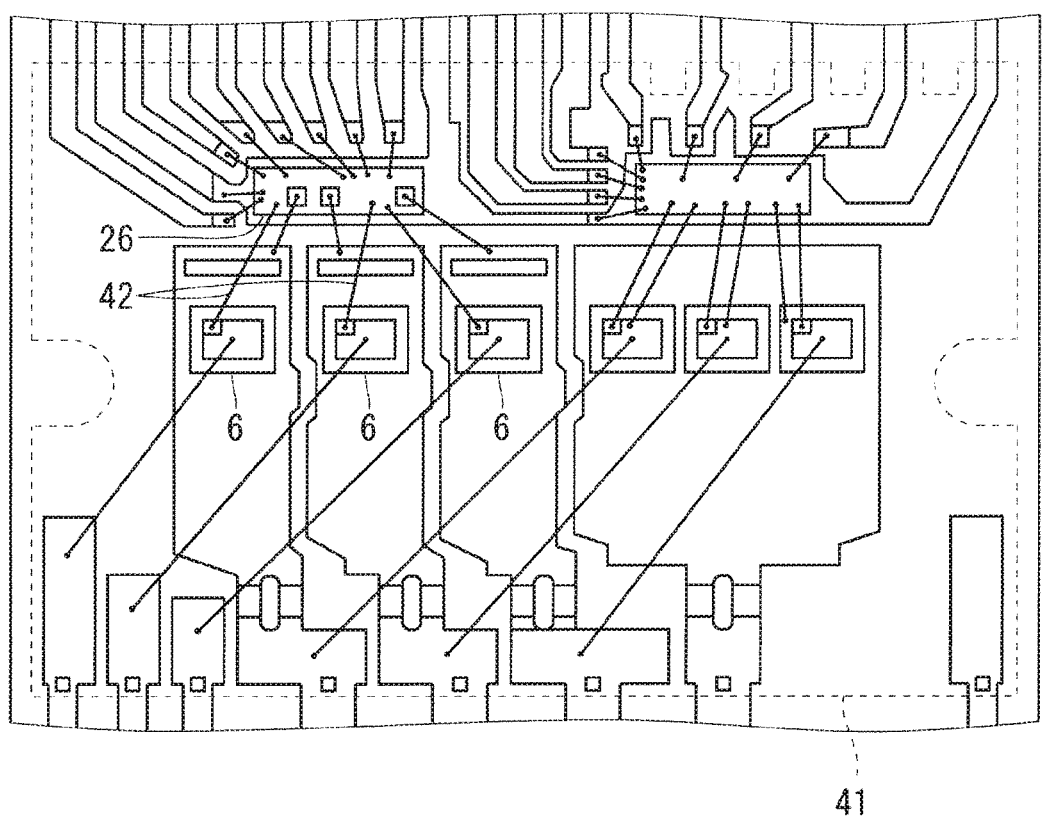

DRIVING DEVICE AND POWER MODULE

BACKGROUND OF THE INVENTION

Field of the Invention

The present invention relates to a driving device for driving a semiconductor switching element and a power module including thereof.

Description of the Background Art

A power semiconductor device using a semiconductor switching element has a configuration in which, when a short circuit is detected by detection of a desaturation method or the like, the semiconductor switching element is interrupted to protect the circuit. Also, for a power module such as an inverter device, provision of an overcurrent-protection circuit to control the load such as a motor has been proposed in, for example, Japanese Patent Application Laid-Open No. 2015-005866.

For overcurrent detection by a shunt method and a sense method, a circuit with a noise filter inserted for suppressing malfunction is commonly used. However, with these methods, difficulty lies in designing a circuit that quickly interrupts the semiconductor switching element due to the noise filter. For this reason, designing the short circuit withstand of the power chip to be appropriate is a difficult task, and there has been a problem that cost reduction of the power chip was hindered. Further, insertion of the filter is unnecessary in short circuit detection by the desaturation method, therefore quick interruption of the semiconductor switching element is allowed, however, there has been a problem that the variation of the power chip is large and the accuracy of current detection is low.

SUMMARY

Accordingly, the present invention has been made in view of the above problem, and to provide a technique capable of complementing overcurrent protection and short circuit protection.

The present invention is a driving device configured to drive a semiconductor switching element connected to a load and includes an overcurrent detector configured to detect whether or not a first current flowing through the load and the semiconductor switching element is abnormal, and a short-circuit detector configured to detect whether or not a second current flowing not through the load but through the semiconductor switching element is abnormal. The driving device interrupts the semiconductor switching element based on a detection result of the overcurrent detector and a detection result of the short-circuit detector.

Overcurrent protection and short-circuit protection can be complemented.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a sequence chart illustrating an operation of the semiconductor device including the driving device according to Embodiment 1;

FIG. 4 is a sequence chart illustrating an operation of a semiconductor device including a driving device according to Embodiment 2; and FIG. 5 is a circuit diagram illustrating a configuration of a power module according to Embodiment 3.

DESCRIPTION OF THE PREFERRED EMBODIMENTS

Embodiment 1

Figure 1:
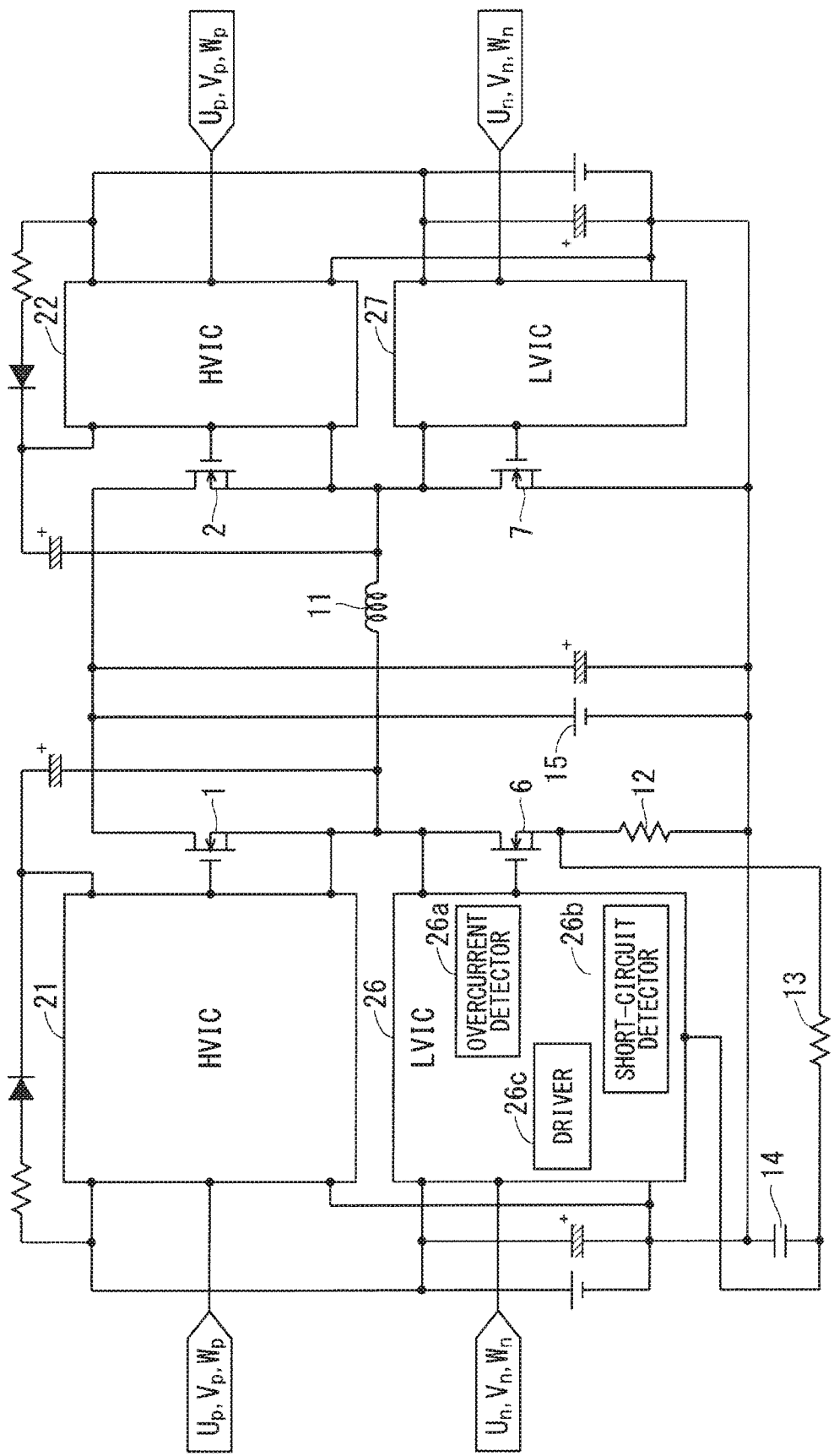
FIG. 1 is a circuit diagram illustrating a configuration of a semiconductor device including a driving device according to Embodiment 1.

FIG. 1 is a circuit diagram illustrating a configuration of a semiconductor device including a driving device according to Embodiment 1 of the present invention.

The semiconductor device of FIG. 1 includes semiconductor switching elements 1, 2, 6, 7, a load 1, a shunt resistor 12, a resistor 13, a capacitor 14, a power supply 15, High Voltage Integrated Circuits (HVIC) 21, 22 which are gate drivers on high side, Low Voltage Integrated Circuits (LVIC) 26, 27 which are gate drivers on low side.

The semiconductor switching elements 1, 2, 6, 7 include, for example, a Metal Oxide Semiconductor Field Effect Transistor (MOSFET), a High Electron Mobility Transistor (HEMT), an Insulated Gate Bipolar Transistor (IGBT), and so forth. The load 11 includes, for example a motor, and so forth.

A source terminal of a semiconductor switching element 1 and a drain terminal of the semiconductor switching element 6 are connected to each other, and the source terminal and the drain terminal are connected to the load 11. A gate terminal of the semiconductor switching element 6 is connected to the LVIC 26 for driving the semiconductor switching element 6 and a source terminal of the semiconductor switching element 6 is connected to a negative electrode (low potential) of the power supply 15 via the shunt resistor 12. A gate terminal of the semiconductor switching element 1 is connected to the HVIC 21 for driving the semiconductor switching element 1 and a drain terminal of the semiconductor switching element 1 is connected to a positive electrode (high potential) of the power supply 15. That is, the semiconductor switching element 1 is connected between the semiconductor switching element 6 and the high potential.

Similar to the connection of the semiconductor switching elements 1, 6, the HVIC 21 and the LVIC 26, the semiconductor switching elements 2, 7, the HVIC 22 and the LVIC 27 are connected.

An electric signal output from the semiconductor switching element 6 is input to the LVIC 26 via the resistor 13 and a branch point to the capacitor 14. The resistor 13 and the capacitor 14 configured as described above function as a low-pass filter.

The LVIC 26, which is a driving device for driving the semiconductor switching element 6, includes an overcurrent detector 26a, a short-circuit detector 26b, and a driver 26c as a driving circuit.

The overcurrent detector 26a determines, by detection by the shunt method, whether or not a first current flowing through the load 11 and the semiconductor switching element 6 is abnormal. In Embodiment 1, the overcurrent detector 26a detects the voltage of the shunt resistor 12 through which the current from which the noise has been removed by the low-pass filter described above flows, and based on the voltage, the overcurrent detector 26a detects the first current flowing through the load 11 and the semiconductor switching element 6.

The overcurrent detector 26a determines whether or not the detected first current is equal to or higher than a threshold value, for example, by a comparator (not shown). The overcurrent detector 26a determines that the first current is abnormal when the first current is equal to or higher than the threshold value and determines that the first current is normal when the first current is smaller than the threshold value. It should be noted that, the overcurrent detector 26a may detect whether or not the first current is abnormal, not by detection by the shunt method, but, for example, by the sense method.

When the overcurrent detector 26a detects that the first current is abnormal, the driver 26c interrupts the semiconductor switching element 6 by outputting a gate signal for interrupting the semiconductor switching element 6.

In Embodiment 1 configured as described above, an overcurrent protection mode for protecting the circuit when the first current flowing through the load 11 and the semiconductor switching element 6 is abnormal is realized. In the overcurrent protection mode, it is difficult to design such a circuit in which the interruption time is equal to or shorter than the filter time. However, the mode is a mode based on the first current in the current path including the load 11, and between the drain and the source of the semiconductor switching element 6, a voltage due to the I-V characteristic of the semiconductor switching element 6, for example, only about 0.1 to 2.31 V is applied. For this reason, compared to a short-circuit mode to be described next, the loss in the semiconductor switching element 6 is low, therefore, a high speed interruption is not necessary.

The short-circuit detector 26b determines, by detection by the desaturation method, whether or not a second current flowing not through the load 11 but through the semiconductor switching element 6 is abnormal.

Figure 2:
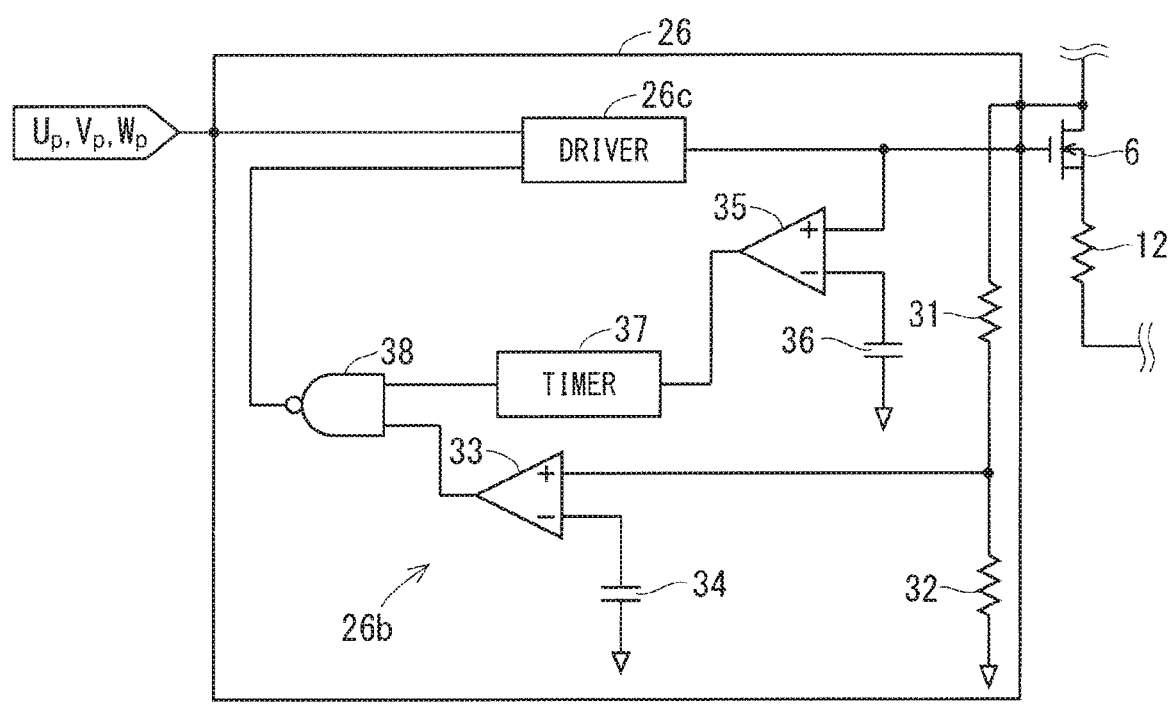
FIG. 2 is a circuit diagram illustrating a configuration of a short-circuit detector according to Embodiment 1.

FIG. 2 is a circuit diagram illustrating a configuration of the short-circuit detector 26b and the driver 26c according to Embodiment 1. The short-circuit detector 26b includes resistors 31, 32, comparators 33, 35, capacitors 34, 36, a timer 37, and a NAND circuit 38.

The drain voltage of the semiconductor switching element 6 is divided by the resistors 31, 32. The comparator 33 determines whether or not the divided voltage of the resistors 31, 32 is equal to or higher than a threshold TH1 corresponding to the voltage of a capacitor 34.

The comparator 35 determines whether or not the gate voltage of the semiconductor switching element 6 is equal to or higher than a threshold TH2 corresponding to the voltage of a capacitor 36. It should be noted that, in FIG. 2, the comparator 35 determines whether or not output of the driver 26c is equal to or higher than the threshold TH2, however, it is not limited thereto, and may determine whether or not input of the driver 26c is equal to or higher than the threshold TH2.

The output indicating the determination result of the comparator 33 and the output indicating the determination result of the comparator 35 are input to the NAND circuit 38 in a state where the output of the comparator 35 is synchronized with the output of the comparator 33 by the timer 37. In the configuration in Embodiment 1, when the second current is normal, the output of the comparator 33 when the divided voltage of the resistors 31, 32 is lower than the threshold value TH1 is input to the NAND circuit 38 in a state where the output of the comparator 33 is delayed by the timer 37 by a given period of time with respect to the output of the comparator 35 when the output of the LVIC 26 exceeds the threshold TH2. In the following description, the given period of time delayed by the timer 37 may be referred to as "filter time".

The NAND circuit 38 performs a NAND operation on the output of the comparator 33 synthesized by the timer 37 and the output of the comparator 35, and outputs the operation result as a detection result as to whether or not the second current is abnormal to the driver 26c.

When the short-circuit detector 26b detects that the second current is abnormal, the driver 26c interrupts the semiconductor switching element 6 by outputting a gate signal for interrupting the semiconductor switching element 6. Here, when a short circuit in which the second current is abnormal occurs in a circuit including no short-circuit detector 26b, the voltage of the power supply 15, for example, a high voltage of 300 V or more, is applied to the drain-source and a large loss occurs in the semiconductor switching element 6, causing problems such as an increase in temperature.

Whereas, the LVIC 26 according to Embodiment 1 includes the short-circuit detector 26b having no filter, therefore, the semiconductor switching element 6 is interrupted earlier than the time at which problems are caused in the semiconductor switching element 6 when a short circuit occurs. In Embodiment 1 as described above, a short-circuit protection mode for protecting the circuit when the second current flowing not through the load 11 but through the semiconductor switching element 6 is abnormal is realized. In the short-circuit protection mode, it is sufficient to protect the circuit from an extremely high voltage of about 100 V or more, so high detection accuracy is not necessary.

FIG. 3 is sequence chart illustrating an operation of short-circuit detection of the semiconductor device according to Embodiment 1. In FIG. 3, the solid line indicates the operation of the semiconductor device during normal operation, that is, when the second current is normal, and the two-dot chain line indicates the operation of the semiconductor device during abnormal operation, that is, when the second current is abnormal. Note that the voltage Vds is the voltage divided by the resistors 31, 32 of the drain voltage.

First, the normal operation will be described. During normal operation, the semiconductor switching elements 6, 7 are turned on until a time elapses by the filter time from a time point t1 when the gate voltage Vg, which is the output of the LVIC 26, exceeds the threshold value TH2, and the drain voltage of the semiconductor switching element 6 is reduced and consequently the voltage Vds is reduced.

A period including a period from the time point t2 to the time point t3 is set as the determination period. The time point t2 is the time point at which the filtering time has elapsed from the time point t1. The time point t3 is the time point at which before the time point at which the semiconductor switching elements 6, 7 next turn OFF. In the determination period during the normal operation, the voltage Vds is determined to be smaller than the threshold value TH1. It should be noted that the threshold value TH1 is set to be equal to or higher than the sum voltage of the voltage Vds at the time of ON and the noise voltage generated at the voltage Vds at the time of turning ON. During the determination period in the normal operation, a High signal and a Low signal are input to the NAND circuit 38, and the NAND circuit 38 outputs the High signal indicating that the second current is normal to the driver 26c. Upon receiving the High signal from the NAND circuit 38, the driver 26c maintains the On state of the semiconductor switching element 6.

Next, the abnormal operation will be described. In the determination period during the abnormal operation, the divided voltage of the resistors 31, 32 is determined to be equal to or higher than the threshold TH1. During the determination period in the abnormal operation, a High signal and a High signal are input to the NAND circuit 38, and the NAND circuit 38 outputs the Low signal indicating that the second current is abnormal to the driver 26c. Upon receiving the Low signal from the NAND circuit 38, the driver 26c interrupts the semiconductor switching element 6.

The LVIC 26 configured as described above interrupts the semiconductor switching element 6 based on the detection result of the overcurrent detector 26a and the detection result of the short-circuit detector 26b. Accordingly, the semiconductor switching element 6 can be interrupted by the short-circuit protection mode earlier than the overcurrent protection mode requiring a time longer than the filter time. Therefore, designing to shorten the time to obtain the short-circuit withstand of the power chip is allowed, leading to reduction of the ON-voltage and improvement of the reliability of the circuit. Also, current detection and protection with high accuracy are allowed by the overcurrent protection mode. Furthermore, by providing the overcurrent detector 26a and the short-circuit detector 26b in the LVIC 26, reductions in the chip size and cost are allowed.

Further, in Embodiment 1, in the LVIC 26, the second current is determined to be abnormal when the voltage (in this case, the voltage Vds) based on the drain voltage of the semiconductor switching element 6 is equal to or higher than the threshold value at the time point at which a predetermined time (in this case, the filter time) elapses from the time point at which the gate voltage of the semiconductor switching element 6 has exceeded the threshold. Thus, overcurrent protection and short-circuit protection can be appropriately controlled so that overcurrent protection and short-circuit protection can be appropriately complemented.

Note that the semiconductor switching element 6 preferably includes a wide bandgap semiconductor such as silicon carbide (SiC) or gallium nitride (GaN). The semiconductor switching element 6 is configured as described above, thereby allowing the reduction in low on-voltage and the reduction in system loss. As a result, the on-resistance per cell can be reduced, therefore, the reduction in system loss, the reduction in chip size, and the reduction in cost are allowed.

Embodiment 2

FIG. 4 is sequence chart illustrating an operation of a semiconductor device according to Embodiment 2. Hereinafter, among components according to Embodiment 2, the same reference numerals are given to the components that are the same as or similar to the above-described components, and different components will mainly be described.

The short-circuit detector 26b according to Embodiment 2 detects whether or not the second current is abnormal based on the gate voltage of the semiconductor switching element 6 and a miller period of the semiconductor switching element 6. As illustrated in FIG. 4, for example, the short-circuit detector 26b may detect that the second current is abnormal, when the time T from the time point at which the gate voltage Vg of the semiconductor switching element 6 rises to the time point at which the gate voltage Vg of the semiconductor switching element 6 becomes equal to the threshold TH3 is smaller than the time Tsc including the miller period mt. For such a short-circuit detecting section 26b, for example, the circuit disclosed in WO2014/115272 can be used. In addition, for example, the short-circuit detector 26b may also detect that the second current is abnormal, when the gate voltage Vg of the semiconductor switching element 6 is equal to or higher than the threshold value TH3 at the time point within the miller period mt of the semiconductor switching element 6.

According to the above configuration, even if the wiring between the drain terminal and the LVIC 26 provided in Embodiment 1 is not provided, the short-circuit detector 26b that detects whether or not the second current is abnormal, similarly to Embodiment 1, can be realized. Therefore, cost reduction of the device can be expected. In the short-circuit detector 26b configured as described above, the detection accuracy is relatively low because there is variation in the miller voltage and consequently in the miller period mt. however, as described in Embodiment 1, in the short-circuit detector 26b, the detection accuracy may be low to some extent.

Embodiment 3

FIG. 5 is a plan view illustrating a configuration of a power module according to Embodiment 3. Hereinafter, among components according to Embodiment 3, the same reference numerals are given to the components that are the same as or similar to the above-described components, and different components will mainly be described.

The power module of FIG. 5 includes a plurality of semiconductor switching elements 6, an LVIC 26, and a single package 41. The package 41 covers the plurality of semiconductor switching elements 6 and the LVIC 26 and covers the connection portion 42 between the plurality of semiconductor switching elements 6 and the LVIC 26. Thus, drain voltage signals of the semiconductor switching elements 6 can be input to the LVIC 26 inside the package 41. Therefore, even if the insulation interval of the external pins in the power module according to Embodiment 3 is made narrower than the insulation interval of the external pins in the power module having the external pins provided on the substrate, the resistance against high voltage is maintained. As a result, reduction in size of the power module and the cost is allowed.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A driving device configured to drive a semiconductor switching element connecting to a load, comprising:
   an overcurrent detector configured to detect whether or not a first current flowing through the load and the semiconductor switching element is abnormal; and
   a short-circuit detector including a plurality of comparators that provide respective outputs based on respective voltages at the semiconductor switching element, and a timer configured to synchronize the respective outputs of the comparators, such that the short-circuit detector is configured to detect whether or not a second current flowing not through the load and but through the semiconductor switching element is abnormal, wherein based on a detection result of the overcurrent detector and a detection result of the short-circuit detector, the semiconductor switching element is interrupted.

2. The driving device according to claim 1, wherein the short-circuit detector is configured to determine, by detection by a desaturation method, whether or not the second current is abnormal.

3. The driving device according to claim 2, wherein the short-circuit detector is configured to detect that the second current is abnormal when a voltage based on a drain voltage of the semiconductor switching element is equal to or higher than a threshold value at a time point at which a predetermined time elapses from a time point at which a gate voltage of the semiconductor switching element has exceeded a threshold value.

4. The driving device according to claim 1, wherein the short-circuit detector is configured to detect whether or not the second current is abnormal based on the gate voltage of the semiconductor switching element and a miller period of the semiconductor switching element.

5. The driving device according to claim 2, wherein the overcurrent detector is configured to determine, by detection by a shunt method or a sense method, whether or not a first current is abnormal.

6. The driving device according to claim 1, wherein the semiconductor switching element includes a wide band gap semiconductor.

7. A power module, comprising:
the driving device according to claim 1;
the semiconductor switching element; and
a package covering a connection portion between a drain terminal of the semiconductor switching element and the driving device.

8. The power module according to claim 7, further comprising
an another semiconductor switching element connected to the load and connected between the semiconductor switching element and a high potential, wherein
the semiconductor switching element is connected to a low potential.

9. A driving device configured to drive a semiconductor switching element connecting to a load, comprising:
an overcurrent detector configured to detect whether or not a first current flowing through the load and the semiconductor switching element is abnormal; and
a short-circuit detector configured to detect whether or not a second current flowing not through the load and but through the semiconductor switching element is abnormal, wherein
based on a detection result of the overcurrent detector and a detection result of the short-circuit detector, the semiconductor switching element is interrupted, and
the short-circuit detector is configured to detect that the second current is abnormal when a voltage based on a drain voltage of the semiconductor switching element is equal to or higher than a threshold value at a time point at which noise has been removed by a filter at the drain voltage of the semiconductor switching element from a time point at which a gate voltage of the semiconductor switching element has exceeded a threshold value.

* * * * *

(12) EX PARTE REEXAMINATION CERTIFICATE (250th)
Ex Parte Reexamination Ordered under 35 U.S.C. 257

United States Patent
Sakai

(10) Number: US 11,146,254 C1
(45) Certificate Issued: Mar. 19, 2025

(54) DRIVING DEVICE AND POWER MODULE

(71) Applicant: Mitsubishi Electric Corporation, Tokyo (JP)

(72) Inventor: Shinji Sakai, Tokyo (JP)

(73) Assignee: MITSUBISHI ELECTRIC CORPORATION, Tokyo (JP)

Supplemental Examination Request:
No. 96/000,421, Jan. 31, 2023

Reexamination Certificate for:
Patent No.: 11,146,254
Issued: Oct. 12, 2021
Appl. No.: 16/265,689
Filed: Feb. 1, 2019

(30) Foreign Application Priority Data

Mar. 20, 2018 (JP) .................... 2018-051896

(51) Int. Cl.
H03K 17/0812 (2006.01)
H01L 23/00 (2006.01)
H02H 1/00 (2006.01)

(52) U.S. Cl.
CPC ....... *H03K 17/08122* (2013.01); *H01L 24/49* (2013.01); *H02H 1/0007* (2013.01); *H03K 17/08128* (2013.01); *H01L 2924/13055* (2013.01); *H01L 2924/13064* (2013.01); *H01L 2924/13091* (2013.01); *H01L 2924/1426* (2013.01)

(58) Field of Classification Search
None
See application file for complete search history.

(56) References Cited

To view the complete listing of prior art documents cited during the supplemental examination proceeding and the resulting reexamination proceeding for Control Number 96/000,421, please refer to the USPTO's Patent Electronic System.

*Primary Examiner* — Kenneth Whittington

(57) ABSTRACT

To provide a technique to complement overcurrent protection and short circuit protection. An LVIC includes an overcurrent detector configured to detect whether or not a first current flowing through a load and a semiconductor switching element is abnormal and a short-circuit detector configured to detect whether or not a second current flowing not through the load but through the semiconductor switching element is abnormal. The LVIC interrupts the semiconductor switching element based on a detection result of the overcurrent detector and a detection result of the short-circuit detector.

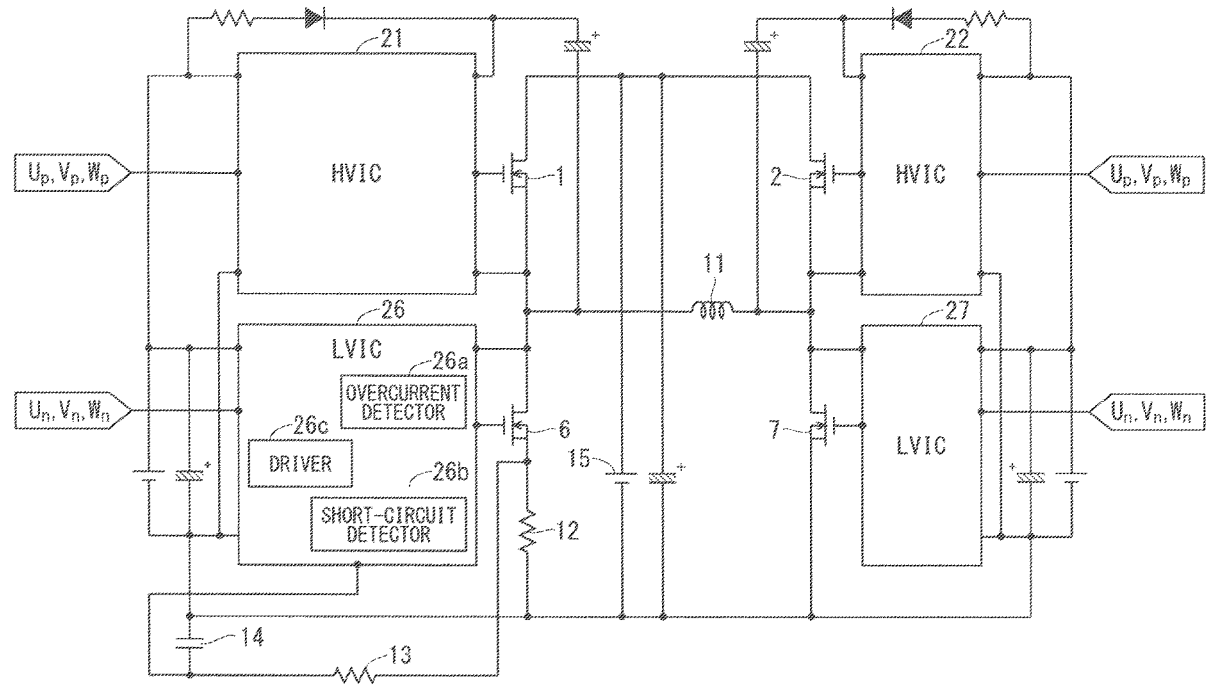

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 4 is cancelled.

Claims 1, 3 and 9 are determined to be patentable as amended.

Claims 2 and 5-8, dependent on an amended claim, are determined to be patentable.

1. A driving device configured to drive a semiconductor switching element connecting to a load, comprising:
    an overcurrent detector configured to detect whether or not a first current flowing through the load and the semiconductor switching element is abnormal [and] *by detecting a filtered voltage of the semiconductor switching element*;
    a short-circuit detector including a plurality of comparators that provide respective outputs based on respective voltages at the semiconductor switching element, and a timer configured to synchronize the respective outputs of the comparators, such that the short-circuit detector is configured to detect whether or not a second current flowing not through the load and but through the semiconductor switching element is abnormal[, wherein]; *and*
    *a driver configured to interrupt the semiconductor switching element based on a detection result of the overcurrent detector and a detection result of the short-circuit* detector[, the semiconductor switching element is interrupted], *and*
    *the timer is further configured to have a delay period, the delay period being shorter than a time period between the gate voltage of the semiconductor switching elements reaching a threshold value and a time point at which the overcurrent detector detects the filtered voltage.*

3. The driving device according to claim 2, wherein
    the short-circuit detector is configured to detect that the second current is abnormal when a voltage based on a drain voltage of the semiconductor switching element is equal to or higher than [a] *another* threshold value at a time point at which a predetermined time elapses from a time point at which [a] *the* gate voltage of the semiconductor switching element has exceeded [a] *the* threshold value.

9. A driving device configured to drive a semiconductor switching element connecting to a load, comprising:
    an overcurrent detector configured to detect whether or not a first current flowing through the load and the semiconductor switching element is abnormal *by detecting a filtered voltage of the semiconductor switching element*; and
    a short-circuit detector configured to detect whether or not a second current flowing not through the load and but through the semiconductor switching element is abnormal, *the short-circuit detector including a timer configured to delay an output of the short-circuit detector*, wherein
    *a driver configured to interrupt the semiconductor switching element* based on a detection result of the overcurrent detector and a detection result of the short-circuit detector,[the semiconductor switching element is interrupted, and]
    the short-circuit detector is configured to detect that the second current is abnormal when a voltage based on a drain voltage of the semiconductor switching element is equal to or higher than a threshold value at a time point at which noise has been removed by a filter at the drain voltage of the semiconductor switching element from a time point at which a gate voltage of the semiconductor switching element has exceeded a threshold value, *and*
    *the timer is further configured to have a delay period, the delay period being shorter than a time period between the gate voltage of the semiconductor switching elements reaching a threshold value and a time point at which the overcurrent detector detects the filtered voltage.*

* * * * *